(12) United States Patent
Ichihara et al.

(10) Patent No.: US 10,763,407 B2
(45) Date of Patent: Sep. 1, 2020

(54) LIGHT EMITTING DEVICE

(71) Applicant: NICHIA CORPORATION, Anan-shi, Tokushima (JP)

(72) Inventors: Yoshio Ichihara, Anan (JP); Mitsuhiro Isono, Itago-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/369,715

(22) Filed: Mar. 29, 2019

(65) Prior Publication Data

US 2019/0305196 A1 Oct. 3, 2019

(30) Foreign Application Priority Data

Mar. 30, 2018 (JP) ................................ 2018-067211

(51) Int. Cl.
*H01L 33/54* (2010.01)
*H01L 33/48* (2010.01)
(Continued)

(52) U.S. Cl.
CPC .............. *H01L 33/54* (2013.01); *H01L 23/02* (2013.01); *H01L 23/04* (2013.01); *H01L 23/10* (2013.01); *H01L 23/16* (2013.01); *H01L 23/28* (2013.01); *H01L 23/31* (2013.01); *H01L 23/3107* (2013.01); *H01L 23/3142* (2013.01); *H01L 24/48* (2013.01); *H01L 33/44* (2013.01); *H01L 33/483* (2013.01); *H01L 33/486* (2013.01);
(Continued)

(58) Field of Classification Search
CPC ....... H01L 33/44; H01L 33/48; H01L 33/483; H01L 33/486; H01L 33/52; H01L 33/54; H01L 23/02; H01L 23/04; H01L 23/10; H01L 23/16; H01L 23/28; H01L 23/31; H01L 23/3107; H01L 23/3142
See application file for complete search history.

(56) References Cited

U.S. PATENT DOCUMENTS 6,610,563 B1 * 8/2003 Waitl ................. H01L 31/0203
438/166
6,809,342 B2 * 10/2004 Harada ................... H01L 33/44
257/79
(Continued)

FOREIGN PATENT DOCUMENTS

JP 8-32120 A 2/1996
JP 2002-329892 A 11/2002
(Continued)

*Primary Examiner* — Eduardo A Rodela
(74) *Attorney, Agent, or Firm* — Birch, Stewart, Kolasch & Birch, LLP

(57) ABSTRACT

A light emitting device includes a package, a light emitting element, and a light-transmissive encapsulant. The package has a top surface and a recessed portion formed with an opening at the top surface. The light emitting element is located on a bottom surface of the recessed portion. The light-transmissive encapsulant is supplied in the recessed portion. The package is provided with a groove formed in the top surface and surrounding the opening. A surface of the groove includes depressed portions and projecting portions. The encapsulant covers at least a part of the surface of the groove, and a portion of the encapsulant that covers the surface of the groove includes a surface irregularity.

13 Claims, 2 Drawing Sheets

(51) Int. Cl.
  *H01L 33/56* (2010.01)
  *H01L 33/60* (2010.01)
  *H01L 23/00* (2006.01)
  *H01L 33/62* (2010.01)
  *H01L 23/16* (2006.01)
  *H01L 23/31* (2006.01)
  *H01L 23/04* (2006.01)
  *H01L 23/02* (2006.01)
  *H01L 23/28* (2006.01)
  *H01L 33/44* (2010.01)
  *H01L 23/10* (2006.01)
  *H01L 33/52* (2010.01)

(52) U.S. Cl.
  CPC .............. *H01L 33/52* (2013.01); *H01L 33/56* (2013.01); *H01L 33/60* (2013.01); *H01L 33/62* (2013.01); *H01L 2224/48091* (2013.01); *H01L 2224/48247* (2013.01); *H01L 2924/12041* (2013.01)

(56) References Cited

U.S. PATENT DOCUMENTS

| | | | | |
|---|---|---|---|---|
| 7,210,807 B2* | 5/2007 | Sakamoto | H01L 33/486 | 257/100 |
| 7,675,081 B2* | 3/2010 | Low | H01L 31/0203 | 257/98 |
| 7,939,842 B2* | 5/2011 | Loh | H01L 33/52 | 257/81 |
| 8,395,181 B2* | 3/2013 | Cho | H01L 33/58 | 257/100 |
| 8,669,572 B2* | 3/2014 | Leung | H01L 33/486 | 257/98 |
| 9,048,393 B2* | 6/2015 | Zitzlsperger | H01L 33/486 | |
| 9,159,884 B2* | 10/2015 | Park | H01L 33/486 | |
| 2006/0022215 A1* | 2/2006 | Arndt | H01L 33/486 | 257/99 |
| 2006/0186423 A1* | 8/2006 | Blonder | H01L 25/0753 | 257/98 |
| 2008/0029775 A1* | 2/2008 | Liu | H01L 33/52 | 257/98 |
| 2008/0054286 A1* | 3/2008 | Loh | H01L 33/52 | 257/98 |
| 2010/0065879 A1 | 3/2010 | Kirsch et al. | | |
| 2012/0112220 A1* | 5/2012 | West | H01L 33/46 | 257/98 |
| 2016/0133804 A1* | 5/2016 | Lee | H01L 33/56 | 257/98 |
| 2016/0300989 A1* | 10/2016 | Kawano | H01L 33/62 | |
| 2018/0315912 A1* | 11/2018 | Yun | H01L 33/502 | |

FOREIGN PATENT DOCUMENTS

| | | |
|---|---|---|
| JP | 2005-223216 A | 8/2005 |
| JP | 2007-324150 A | 12/2007 |
| JP | 2008-130836 A | 6/2008 |
| JP | 2010-16068 A | 1/2010 |
| JP | 2010-206039 A | 9/2010 |
| JP | 2011-199219 A | 10/2011 |
| WO | WO 2008/104165 A1 | 9/2008 |

* cited by examiner

LIGHT EMITTING DEVICE

CROSS-REFERENCE TO RELATED APPLICATION

This application claims priority to Japanese Patent Application No. 2018-067211, filed on Mar. 30, 2018, the disclosure of which is hereby incorporated by reference in its entirety.

BACKGROUND

The present application relates to a light emitting device.

A large-scale display device in which a plurality of light emitting devices as pixels are disposed in a matrix, a traffic signal in which a plurality of light emitting devices are disposed, and the like may be used outdoors. Such a display device involves a disadvantage, for example, indirect glare or reduction in contrast of the display caused when light such as external light is incident on a light emitting plane of any of the light emitting devices, the external light is reflected at a peripheral region outer to a light emitting region. For example, in a light emitting device in which a light emitting element is disposed in a recessed portion of a package, an encapsulant supplied in the recessed portion spreads out from the recessed portion. In such a case, the encapsulant located outside the recessed portion reflects external light, which may decrease the display contrast.

In order to address this disadvantage, for example, Japanese Patent Publication No. 2011-199219 discloses locating a dark color layer covering the encapsulant overflowing from the recessed portion of the package onto the peripheral region around the recessed portion.

SUMMARY

One non-limiting, and exemplary embodiment provides a light emitting device with which indirect glare or decrease in the display contrast caused by external light being reflected, is less likely to occur with a simple structure.

In one general aspect, a light emitting device includes a package, a light emitting element, and a light-transmissive encapsulant. The package has a top surface and a recessed portion formed with an opening at the top surface. The light emitting element is located on a bottom surface of the recessed portion. The light-transmissive encapsulant is supplied in the recessed portion. The package is provided with a groove formed in the top surface and surrounding the opening. A surface of the groove includes depressed portions and projecting portions. The encapsulant covers at least a part of the surface of the groove, and a portion of the encapsulant that covers the surface of the groove includes a surface irregularity.

According to the above aspect, it is possible to provide a light emitting device with which indirect glare or decrease in the display contrast caused by external light being reflected is less likely to occur.

DETAILED DESCRIPTION

Figure 1:
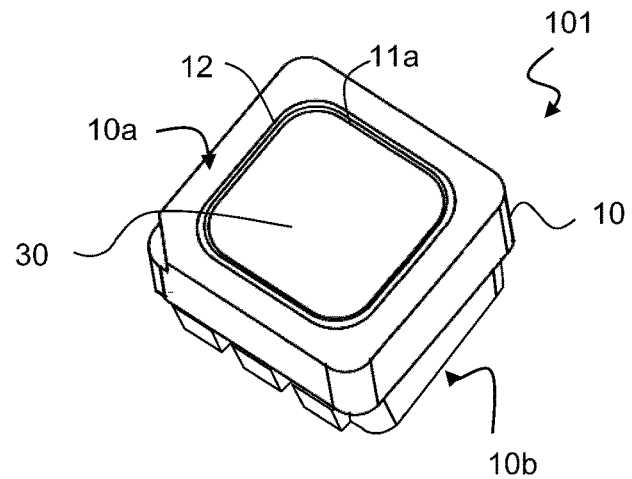
FIG. 1 is a perspective view showing a light emitting device in an embodiment.

Hereinafter, embodiments of a light emitting device according to the present disclosure will be described with reference to the attached drawings. A light emitting device described below is an example of the embodiments, and various modifications may be made on the light emitting device described below. In the drawings, the sizes, the shapes or the like of the components may be exaggerated for easier understanding, and may not reflect the sizes or the shapes of the components or the size relationship among the components in an actual light emitting device or an actual production device. In order to avoid the drawings from being excessively complicated, a part of the components may be omitted in the drawings.

In the following description, the components having substantially the same functions will be represented by a common reference sign, and the descriptions thereof may be omitted. In the following description, terms representing a specific direction or position (e.g., "up", "down", "right", "left" or another term related to such a term) will be used. Such terms will be merely used for easier understanding of a relative direction or position in any of the drawings referred to. In a drawing other than those in the present disclosure, in an actual product, an actual production device or the like, the components merely need to have a directional or positional relationship represented by the term "up", "down" or the like used regarding the drawing(s) referred to, but do not need to be located exactly as in the drawing(s) referred to.

A light emitting device according to the present disclosure includes a package having a top surface provided with a recessed portion with which an opening is formed at the top surface, a light emitting element located on a bottom surface of the recessed portion, and a light-transmissive encapsulant supplied in the recessed portion. The package is provided with a groove formed so as to surround the opening at the top surface. A surface of the groove includes coarse portion. The encapsulant covers at least a part of the surface of the groove, and the encapsulant covering the surface of the groove includes coarse portion at a surface thereof.

Figure 2:
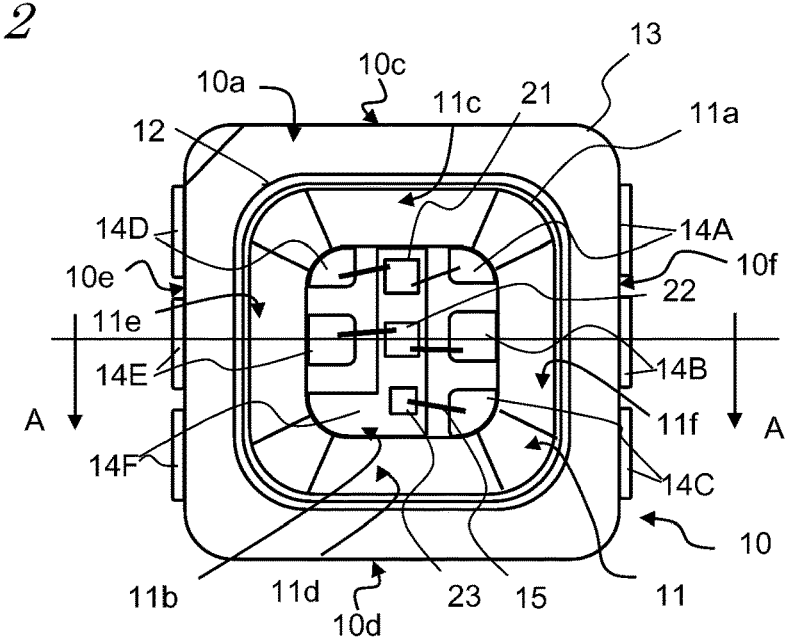
FIG. 2 is a top view of the light emitting device not showing an encapsulant.
Figure 3:
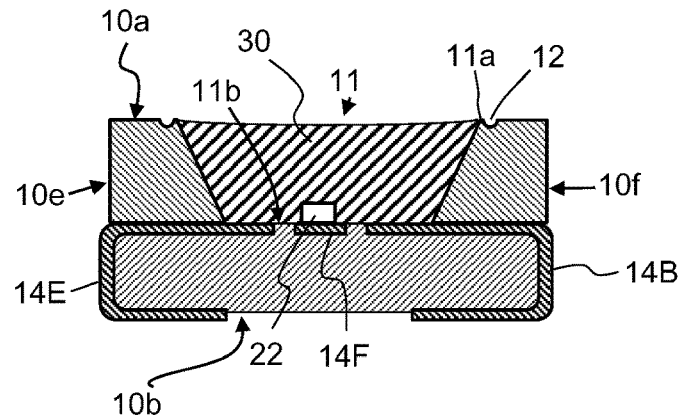
FIG. 3 is a cross-sectional view of the light emitting device taken along line A-A in FIG. 2.

FIG. 1 is a perspective view of a light emitting device 101 according to the present disclosure. FIG. 2 is a top view of the light emitting device 101 not showing a encapsulant 30 to expose light emitting elements 21, 22 and 23. FIG. 3 is a cross-sectional view of the light emitting device 101 taken along line A-A in FIG. 2.

The light emitting device 101 includes a package 10, the light emitting elements 21, 22 and 23, and the encapsulant 30. Hereinafter, these components will be described in detail.

The package 10 serves as a housing accommodating the light emitting elements 21, 22 and 23. The package 10 includes a top surface 10*a*, a lower surface 10*b*, and a recessed portion 11 formed with an opening 11*a* at the top surface 10*a*. In this embodiment, the top surface 10*a* has a substantially rectangular shape with rounded corners, and the package 10 includes four lateral portions 10*c*, 10*d*, 10*e* and 10*f* corresponding to four sides of the rectangular shape of the top surface 10*a*. The package 10 is provided with a groove 12 surrounding the opening 11*a* at the top surface 10*a*.

The opening 11a may have a substantially circular shape, a substantially rectangular shape with rounded corners, or the like as seen in a top view. The groove 12 is formed at the top surface 10a along the opening 11a. The groove 12 may surround the opening 11a or may be partially formed along the opening 11a. The groove 12 is preferably formed in a frame shape surrounding the opening 11a along an outer perimeter of the opening 11a as seen in a top view.

A depth of the groove 12 varies in accordance with the size of the package 10, and is, for example, about 50 μm to about 150 μm. The groove 12 has a width of, for example, about 100 μm to about 300 μm as seen in a top view. As seen in a top view, it is preferred that the groove 12 and the opening 11a are as close as possible to each other, and it is more preferred that the groove 12 is in contact with the opening 11a. In other words, it is preferred that the groove 12 and the opening 11a have a common boundary in a top view.

In this embodiment, the package 10 includes a base member 13, and lead terminals 14A, 14B, 14C, 14D, 14E and 14F. The base member 13 has a main portion of the package 10, and the top surface 10a provided with the recessed portion 11 with which the opening 11a is formed, and the lower surface 10b.

The recessed portion 11 has a bottom surface 11b. The light emitting elements 21, 22 and 23 are located on the bottom surface 11b. The recessed portion 11 has an inverted, truncated, substantially rectangular frustum shape formed with the opening 11a as an upper surface and the bottom surface 11b as a bottom surface, and has inner lateral surfaces 11c, 11d, 11e and 11f. The inner lateral surfaces 11c through 11f prevent or alleviate light emitted from the light emitting elements 21, 22 and 23 to exit outside by reflecting and/or blocking the light.

The base member 13 is formed of an insulating material such a resin or the like. It is preferred that the base member 13 is formed of a material that does not easily transmit the light from the light emitting elements 21, 22 and 23 or external light. It is especially preferred that an outer surface of the base member 11 is formed of a material having a low light reflectance to external light such as sunlight or the like, and it is preferred that the outer surface is black or of a dark color. It is also preferred that the base member 13 as a main portion of the package 10 that keeps the structure of the package 10, has a predetermined strength. The base member 13 is formed of, for example, a thermosetting resin, a thermoplastic resin or the like. More specifically, the base member 13 is formed of an epoxy resin, a silicone resin, a phenol resin, a glass epoxy resin, BT resin, PPA or the like. The inner lateral surfaces 11c through 11f of the recessed portion 11 of the base member 13 may be formed of a material that reflects the light from the light emitting elements 21, 22 and 23. In other words, the inner lateral surfaces 11c through 11f may be formed of a material having a light reflectance, to the light emitted from the light emitting elements 21, 22 and 23, higher than that of the material used to form the outer surface of the base member 13. With such an arrangement, the light emitting device 101 has an improved light extraction efficiency.

The lead terminals 14A, 14B, 14C, 14D, 14E and 14F serve as terminals that electrically connect the light emitting elements 21, 22 and 23 to component(s) outside of the package 10 such as wiring. The lead terminals 14A, 14B, 14C, 14D, 14E and 14F are each partially exposed on the bottom surface 11b of the recessed portion 11 of the base member 13. Other parts of the lead terminals 14A, 14B, 14C, 14D, 14E and 14F are each exposed on the lateral surfaces 10e and 10f and at the lower surface 10b. The remaining parts of the lead terminals 14A, 14B, 14C, 14D, 14E and 14F are embedded in the base member 13.

The shape of the lead terminals 14A, 14B, 14C, 14D, 14E and 14F can be appropriately determined. For example, as described above, a part of each of the lead terminals 14A through 14F is exposed on the bottom surface 11b of the recessed portion 11, and the other part may be exposed on the lateral surfaces and bent to extend along the outer surface of the package 10 so as to be provided at the lower surface side as shown in FIG. 3. Alternatively, a part of each of the lead terminals 14A through 14F is exposed on the bottom surface 11b of the recessed portion 11, and at least one of other parts of those lead terminals are exposed at the lower surface 10b. With such a structure, the light emitting elements 21, 22 and 23 located in the recessed portion 11 can electrically be connectable with the outside of the package 10.

It is preferred that the lead terminals 14A, 14B, 14C, 14D, 14E and 14F are formed of a material having a relatively high thermal conductivity. The lead terminals 14A through 14F may be formed of such a material, so that the heat generated in the light emitting elements 21, 22 and 23 is dissipated to the outside of the package 10 efficiently. For example, a material having a thermal conductivity of about 200 W/(m·K) or higher is preferred. It is further preferred that the material of the lead terminals 14A through 14F has a relatively high mechanical strength. For example, a metal plate formed of aluminum, iron, nickel, copper, or an alloy containing any of these metal materials may be formed into a desired shape by, for example, a press process such as punching or the like, or etching, and the resultant plate may be used as each of the lead terminals 14A through 14F. It is also preferred that the lead terminals 14A, 14B, 14C, 14D, 14E and 14F are covered with a metal film. A preferably usable material of the metal film is, for example, Ag, an Ag alloy, Au, an Au alloy or the like. It is preferred that the lead terminals 14A through 14F include an Ni-containing layer as an underlying layer for the metal film. The underlying layer may be a layer containing Ni/Pd, Ni/Au, Ni/Pd/Au or the like. The metal film may be formed by, for example, plating. The lead terminals 14A through 14F including such a metal film can have an increased light reflectance and/or an increased adherence with a metal wire or the like described below. The lead terminals 14A through 14F have a thickness of, for example, 110 μm to 250 μm. The thickness of the lead terminals 14A through 14F may have partially different thickness from the rest thereof due to the above-described process or the like.

The light emitting elements 21, 22 and 23 are each a semiconductor light emitting element such as a semiconductor laser, a light emitting diode. The wavelength of the light to be emitted by each of the light emitting elements 21, 22 and 23 may be appropriately selected. For example, a light emitting element emitting blue or green light may be formed of ZnSe or a nitride-based semiconductor (In$_x$Al$_y$Ga$_{1-x-y}$N, 0≤X, 0≤Y, X+Y≤1). A light emitting element emitting red light may be formed of a GaAs-based semiconductor, an AlInGaP-based semiconductor, an AlGaAs-based semiconductor or the like. A semiconductor light emitting element formed of any other appropriate material is also usable. The composition, color of light emission, size, number or the like of the light emitting element to be used may be optionally selected in accordance with the purpose of use. The light emitting element may emit ultraviolet light or infrared light as well as light in a visible light region. Furthermore, a light receiving element or the like may be mounted together with the semiconductor light emitting element. Alternatively, a fluorescent material that converts the wavelength of the light emitted by the semiconductor light emitting element may be provided around the semiconductor light emitting element, so that desired color of light is provided. For example, a semiconductor light emitting element emitting blue light and a fluorescent material emitting yellow light may be combined to provide white light. In the case where the light emitting device 101 is used for, for example, color display, the light emitting elements 21, 22 and 23 may respectively output red light, blue light and green light. The above-described numbers of the light emitting elements and the above-described combinations of colors are merely examples, and the configuration of the light emitting device is not required thereto.

In this embodiment, the light emitting elements 21, 22 and 23 are located on the lead terminal 14F exposed on the bottom surface 11b of the recessed portion 11. A pair of positive and negative electrodes of the light emitting element 21 are electrically connected with the lead terminals 14A and 14D exposed on the bottom surface 11b of the recessed portion 11, via metal wires 15. One of a pair of positive and negative electrodes of the light emitting element 23 is located on a bottom surface of the light emitting element 23 and is electrically connected with the lead terminal 14F exposed on the bottom surface 11b of the recessed portion 11 via solder, a conductive paste or the like. The other of the positive and the negative electrodes of the light emitting element 23 is electrically connected with the lead terminal 14C exposed on the bottom surface 11b of the recessed portion 11 via a metal wire 15.

The encapsulant 30 protects the light emitting elements 21, 22 and 23, the metal wires 15 and the like located in the recessed portion 11 against moisture, an external force, dust or the like. The encapsulant 30 is supplied into the recessed portion 11, and covers the light emitting elements 21, 22 and 23 and the metal wires 15 in the recessed portion 11. As described below in detail, a part of the encapsulant 30 covers at least a part of a surface 12a of the groove 12 constituting the top surface 10a of the package 10.

It is preferred that the encapsulant 30 is sufficiently light-transmissive to transmit the light from the light emitting elements 21, 22 and 23. Specifically, it is preferred that the encapsulant 30 is formed of a material such as a silicone resin, an epoxy resin or the like. The encapsulant 30 may contain particles of filler such as a light-reflective substance, a fluorescent substance or the like. For example, the encapsulant 30 may contain particles of a light-reflective substance. The particles contained in the encapsulant 30 may be spherical or crushed shape. The encapsulant 30 may contain a light-absorbing substance to such a degree that does not spoil the light transmissive property of the encapsulant 30. The encapsulant 30 may contain an appropriate amount of light-absorbing substance, so that light specularly reflected by, for example, surfaces of the lead terminals exposed in the recessed portion 11 is less likely to exit from a light extraction surface. This can improve the light distribution of the light output from the light emitting device 101.

In the case where the particles of the filler contained in the encapsulant 30 are spherical, such spherical particles are easily sedimented in an uncured material of the encapsulant 30. Therefore, projecting portions corresponding to the shape of the particles are less likely to be formed at a surface of the encapsulant 30, and the light from the light emitting elements 21, 22 and 23 is easily output outside with less scattering at, or in the vicinity of the surface of the encapsulant 30. This can improve the light extraction efficiency from the encapsulant 30. However, such a smooth surface of the encapsulant 30 reflects the external light to easily cause so-called "glare".

By contrast, in the case where the particles of the filler contained in the encapsulant 30 are crushed shape, inmost cases, such crushed particles have surface area sizes larger than those of the spherical particles where the crushed particles and spherical particles are substantially the same particle sizes. Therefore, the crushed particles are less likely to be sedimented in the uncured material of the encapsulant 30. As a result, the particles are allowed to be located at, or in the vicinity of the surface of the encapsulant 30, and thus a coarse portion corresponding to the shape of the particles are easily formed at the surface of the sealing member 30. Therefore, the encapsulant 30 scatters the external light at the surface thereof when reflecting the external light, to thereby alleviate decrease of the contrast due to the external light being reflected. In other words, it is preferred that the encapsulant 30 contains crushed particles in order to alleviate decrease of the contrast due to the external light being reflected.

Alternatively, the encapsulant 30 containing the crushed particles may be disposed in the recessed portion 11, and a dark color layer may be disposed on the surface of the encapsulant 30. With such a structure, a coarse portion corresponding to the shape of the crushed particles are formed at the surface of the dark color layer. Therefore, reflection of the external light is further alleviated, and thus the contrast is less likely to decreased.

It is preferred that the filler in the encapsulant 30 has a concentration of 20% by volume or higher. With such a structure, the filler stays at, or in the vicinity of, the surface of the encapsulant 30, and a coarse portion corresponding to the shape of the particles are formed at the surface of the encapsulant 30. If the concentration of the filler is too high, the light is not easily extracted from the encapsulant 30. This is likely to cause decrease of luminous intensity or uneven light distribution. Therefore, the concentration of the filler is preferably 60% by volume or lower, more preferably 40% by volume or lower, and still more preferably 30% by volume or lower. The size of particles of the filler may be, for example, about 0.5 μm to about 10 μm.

The filler may be formed of a known material. Examples of the light-reflective substance include silicon oxide (i.e., silica), titanium oxide, magnesium oxide, zirconium oxide, barium titanate, aluminum oxide, and the like. The fluorescent substance to be used may be selected in consideration of the wavelengths of the light from the light emitting elements 21, 22 and 23, the color of the light intended to obtain, and the like. Examples of the fluorescent substance include, specifically, cerium-activated yttrium-aluminum-garnet (YAG), cerium-activated lutetium-aluminum-garnet (LAG), europium- and/or chromium-activated nitrogen-containing calcium aluminosilicate (CASN), and the like. A plurality of types of fluorescent substances may be used in combination. For example, a plurality of fluorescent substances emitting different colors of light may be used with a combination or at a mixing ratio suitable to a desired color, so that the color rendering index or the color reproducibility is adjusted. The light-absorbing substance may be, for example, a black pigment such as carbon black, graphite or the like. Such a filler is dispersed in the encapsulant 30, so that, for example, color non-uniformity is decreased, and the display contrast is less likely to reduce.

Figure 4:
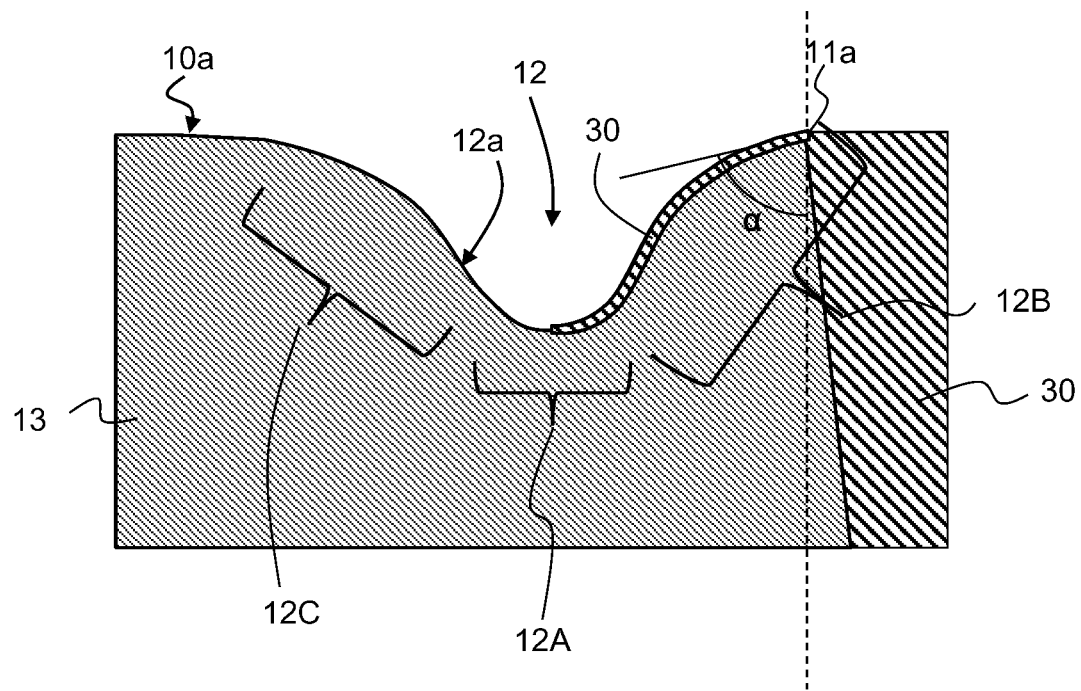
FIG. 4 is an enlarged cross-sectional view of a groove.

A structure of the groove 12 in the light emitting device 101 will be described in detail. FIG. 4 is an enlarged cross-sectional view of the groove 12 formed in the top surface 10a of the package 10. The groove 12 includes a coarse portion at the surface 12a, and the encapsulant 30 covers at least a part of the surface 12a of the groove 12. More specifically, the encapsulant 30 covers at least a part of depressed portions among the coarse portion of the surface 12a of the groove 12.

Figure 5:
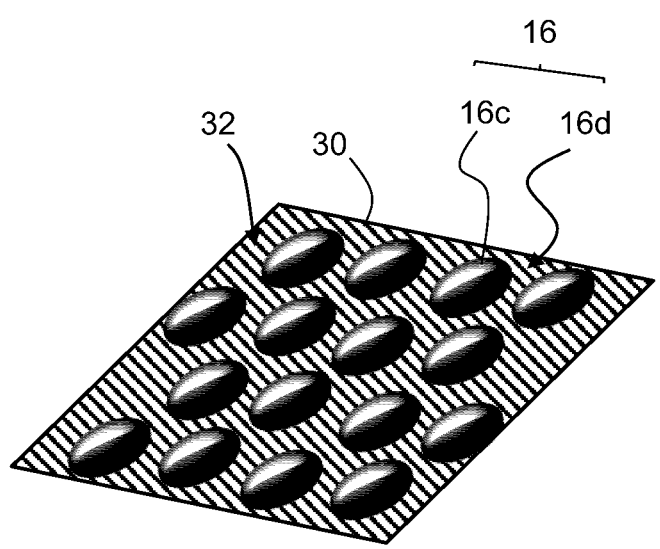
FIG. 5 is a perspective view schematically showing coarse portion of a surface of the groove and a encapsulant on the coarse portion.

FIG. 5 is a perspective view schematically showing such a coarse portion 16 formed at the surface 12a of the groove 12 and the encapsulant 30 on the coarse portion 16. The coarse portion 16 includes projecting portions 16c and depressed portions 16d formed between projecting portions 16c adjacent to each other. The encapsulant 30 is located at the depressed portions 16d. Preferably, as shown in FIG. 5, the encapsulant 30 is not located on the projecting portions 16c. In other words, the encapsulant 30 in the groove 12 includes surface irregularity 32 (or depressed portions and projecting portions) in which the the encapsulant 30 is located selectively at the depressed portions 16d according to the shape of the coarse portion 16 of the surface 12a. In other words, the encapsulant 30 covers the depressed portions 16d, which are parts of the surface 12a of the groove 12, and a part of each of the projecting portions 16c, at least a top portion of each of the projecting portions 16c, is exposed from the encapsulant 30.

In the production of the light emitting device 101, the uncured resin material for forming the encapsulant 30 is located in the recessed portion 11 of the package 10. In this step, if the material of the encapsulant 30 overflows from the opening 11a of the recessed portion 11, the uncured resin material is located on the top surface 10a. Then the resin material is cured, and resultantly the encapsulant 30 is formed on the top surface 10a, more specifically, around the opening 11a. In this manner, a region that easily reflects the external light is formed. Especially if the encapsulant 30 is formed with a great thickness around the opening 11a, the surface of the encapsulant 30 is likely to be flat and easily reflects the external light.

By contrast, the light emitting device 101 in this embodiment is provided with the groove 12 around the opening 11a, and the surface 12a of the groove 12 includes the coarse portion 16. Therefore, the resin material overflowing from the opening 11a flows into the groove 12. The surface 12a of the groove 12 includes the coarse portions 16 having depressed portions 16d and the projecting portions 16c, and the depressed portions 16d between the projecting portions 16c form a narrow flow path. A fluid easily expands via the depressed portions 16d. Therefore, the material of the encapsulant 30 overflowing into the groove 12 does substantially not cover the projecting portions 16c, and expands in the groove 12 via the depressed portions 16d. The encapsulant 30 formed by curing the resin material and located around the opening 11a includes the surface irregularity 32 caused by the depressed portions 16d and the projecting portions 16c of coarse portion 16 on the surface 12a of the groove 12. Therefore, the surface irregularity 32 of the encapsulant 30 easily scatters the external light. Therefore, even though the encapsulant 30 is located outside the recessed portion 11, decrease of the contrast due to the external light being reflected is less likely to occur. The groove 12 including the coarse portion 16 at the surface 12a may be formed by insert molding or the like, integrally with, and at the same time with, the base member 13 of the package 10. Therefore, the light emitting device 101 having the above-described effect is provided with a relatively simple structure and by a simple production method.

If the uncured resin material of the encapsulant 30 is located as a thick layer around the opening 11a, the resin material has a smooth surface after being cured and easily reflects the external light. Therefore, it is preferred that the material of the encapsulant 30 overflowing to the region around the opening 11a expands with a small thickness as much as possible in the groove 12 in order to reflect the coarse portion 16 at the surface 12a of the groove 12, whereby the external light is easily scattered. For this purpose, it is preferred that the groove 12 has a structure capable of expanding the material of the encapsulant 30 with a small thickness around the opening 11a. Specifically, the groove 12 has a bottom portion 12A and lateral portions 12B and 12C sandwiching the bottom portion 12A as seen in a cross-sectional view taken in a direction crossing the direction in which the groove 12 longitudinally extends. It is preferred that the bottom portion 12A has a U-shaped cross-section and does not include a flat portion. The bottom portion 12A is not flat and is curved as seen in a cross-sectional view, so that the material of the encapsulant 30 easily expands without staying in the bottom portion 12A as a thick layer.

It is preferred that the groove 12 is structured to allow the material of the encapsulant 30, overflowing from the opening 11a of the recessed portion 11, to easily expand into the groove 12. Specifically, it is preferred that the lateral portion 12B has an angle α of 80 degrees or smaller with respect to the vertical direction (e.g., a direction perpendicular to the bottom surface 11b of the recessed portion 11 in this embodiment) at a connection point between the opening 11a and the lateral portion 12B. The lateral portion 12B of the groove 12 is inclined from the connection point with the opening 11a, to thereby prevent or alleviate the material of the encapsulant 30 overflowing from the opening 11a of the recessed portion 11 from being retained in the vicinity of the outer perimeter of the opening 11a, and be easily guided into the groove 12.

It is preferred that the lateral portions 12B and 12C have a curved shape convexed inward of the groove 12 in a cross-sectional view. Also in a cross-sectional view, it is preferred that the lateral portion 12B closer to the recessed portion 11, among the lateral portions 12B and 12C, is connected with the opening 11a of the recessed portion 11 via a curved line. It is also preferred that the contact portion of the lateral portion 12B of the groove 12 and the opening 11a defines an acute angle. Such a shape can weaken the current of the material of the encapsulant 30 flowing into the groove 12, and thus the uncured resin material of the encapsulant 30 overflowing from the opening 11a is prevented or alleviated from being retained in the bottom portion 12A of the groove 12 with unnecessarily large amount.

It is preferred that the surface 12a of the groove 12 has a surface roughness of, for example. 0.4 µm or greater and 1.0 µm or less. The surface roughness is represented by the arithmetic average height Sa. The surface 12a has a surface roughness in this range, so that the material of the encapsulant 30 easily flows on the depressed portions 16d. This can prevent or alleviate the material of the encapsulant 30 from overflowing from the depressed portions 16d, and thus the material of the encapsulant 30 is less likely to cover the projecting portions 16c. With such a structure, the encapsulant 30 formed by the curing the material thereof scatters the external light and alleviates decrease of the contrast due to the external light being reflected.

Preferably, the top surface 10a has a coarse portion in a region other than the groove 12. With such a structure, the top surface 10a outside the groove 12 also scatters the external light and alleviates decrease of the contrast due to the external light being reflected. For example, the region of the top surface 10a that has the coarse portion may have a surface roughness substantially equal to that of the surface 12a of the groove 12. The package 10 having such a structure may be preferably formed by, for example, insert molding by use of a mold having a surface roughness of 0.4 µm or greater and 1.0 µm or less in a surface corresponding to the top surface 10a with the groove 12.

As described above, in this embodiment, the groove 12 including the coarse portion 16 at the surface 12a surrounds the recessed portion 11 at the top surface 10a of the package 10. With such a structure, the material of the encapsulant 30 overflowing from the opening 11a is alleviated from being formed as a thick layer. Thus, an encapsulant reflecting the external light is alleviated from being located around the opening 11a. The resultant light emitting device 101 with which the indirect glare and the decrease in the display contrast caused by the external light being reflected is less likely to occur.

In the above-described embodiment, the groove 12 may be formed continuously in the region around the opening 11a. Alternatively, the groove 12 may be disconnected at one or a plurality of positions. In this case, it is preferred that a gap(s) at which the grooves 12 are disconnected has a minimum possible length.

In the above-described embodiment, one groove 12 is formed in the top surface 10a. Alternatively, a plurality of the grooves 12 may be formed.

The light emitting device according to the present disclosure is preferably usable for various uses. Especially, the light emitting device according to the present disclosure is suitably usable for outdoor applications such as a large-scale display device, a traffic signal or the like.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device, comprising:
    a package having a top surface and a recessed portion formed with an opening at the top surface;
    a light emitting element located on a bottom surface of the recessed portion; and
    a light-transmissive encapsulant supplied in the recessed portion,
    wherein the package is provided with a groove formed in the top surface and surrounding the opening,
    wherein a surface of the groove includes depressed portions and projecting portions, and
    wherein the encapsulant covers at least apart of the surface of the groove, and a portion of the encapsulant that covers the surface of the groove includes a surface irregularity.

2. The light emitting device of claim 1, wherein the surface irregularity of the portion of the encapsulant that covers the surface of the groove is formed by the depressed portions and projecting portions of the surface of the groove.

3. The light emitting device of claim 1, wherein a part of the surface of the groove is exposed from the encapsulant.

4. The light emitting device of claim 1, wherein the depressed portions and the projecting portions are formed at the top surface of the package.

5. The light emitting device of claim 1, wherein an upper lateral portion of the groove has a curved shape convexed inward of the groove as seen in a cross-sectional view.

6. The light emitting device of claim 1, wherein a bottom portion of the groove is U-shaped as seen in a cross-sectional view.

7. The light emitting device of claim 1,
    wherein a lateral portion of the groove is continuous with an inner lateral surface of the recessed portion, and
    wherein the lateral portion of the groove has an angle of 80 degrees or smaller with respect to a vertical direction at a connection point located between the opening and the lateral portion in a cross-sectional view.

8. The light emitting device of claim 1, wherein the surface of the groove and the top surface of the package have a substantially equal surface roughness.

9. The light emitting device of claim 1, wherein the surface of the groove and the top surface of the package each have a surface roughness of 0.4 µm or greater and 1.0 µm or less.

10. The light emitting device of claim 1, wherein the package includes an insulative base member and a lead terminal.

11. The light emitting device of claim 10, wherein the base member has a black-color outer surface.

12. The light emitting device of claim 1, wherein the encapsulant contains a light-reflective substance.

13. The light emitting device of claim 1, wherein the light emitting device includes three light emitting elements respectively emitting red light, blue light and green light.

* * * * *